United States Patent [19]
Ito

[11] Patent Number: 5,159,286
[45] Date of Patent: Oct. 27, 1992

[54] NEGATIVE FEEDBACK AMPLIFIER FOR DRIVING CAPACITIVE LOAD

[75] Inventor: Takeshi Ito, Kawasaki, Japan

[73] Assignee: Kikusui Electronics Corporation, Kanagawa, Japan

[21] Appl. No.: 841,813

[22] Filed: Feb. 26, 1992

[30] Foreign Application Priority Data

Feb. 28, 1991 [JP] Japan .................................. 3-34352

[51] Int. Cl.$^5$ ............................................ H03F 3/45
[52] U.S. Cl. ...................................... 330/260; 330/265
[58] Field of Search ............... 330/260, 265, 255, 290, 330/291, 293

[56] References Cited

U.S. PATENT DOCUMENTS

| | | | |
|---|---|---|---|
| 3,036,274 | 5/1962 | Greatbatch | 330/260 |
| 3,182,269 | 5/1965 | Smith | 330/260 |
| 3,260,947 | 7/1966 | Dorsman | 330/260 |
| 3,327,235 | 6/1967 | Hull | 330/260 |
| 3,399,357 | 8/1968 | Weilerstein | 330/260 |
| 3,419,809 | 12/1968 | Lach et al. | 330/260 |
| 3,496,480 | 2/1970 | Singletary, Jr. | 330/260 |
| 3,922,585 | 11/1975 | Andrews | 330/293 |
| 4,728,903 | 3/1988 | Reiffin | 330/265 |

FOREIGN PATENT DOCUMENTS

| | | |
|---|---|---|
| 50-1975 | 1/1975 | Japan . |
| 53-40314 | 10/1978 | Japan . |
| 53-42044 | 10/1978 | Japan . |
| 57-47845 | 10/1982 | Japan . |

OTHER PUBLICATIONS

I.B.M. Technical Disclosure Bulletin, vol. 10, No. 8, Jan. 1968 pp. 1148-1149.

Primary Examiner—Eugene R. LaRoche
Assistant Examiner—Tan Dinh
Attorney, Agent, or Firm—Finnegan, Henderson, Farabow, Garrett and Dunner

[57] ABSTRACT

A negative feedback amplifier including, in an input stage, a common-emitter first transistor and a common-base second transistor for supplying a quiescent collector current (standing current) to the first transistor so that a sufficient standing current flows. A negative feedback circuit is connected between an output terminal of an output stage and the emitter of the second transistor, and a first limiter diode is parallely connected to the feedback circuit so as to prevent saturation of an NPN transistor of the output stage. The common-base transistor in the input stage makes it possible to select a high resistance resistor as a feedback resistor, thus enabling the standing current of the output stage to be reduced. A second limiter diode may be connected between the output terminal and the input terminal of the output stage.

10 Claims, 5 Drawing Sheets

NEGATIVE FEEDBACK AMPLIFIER FOR DRIVING CAPACITIVE LOAD

BACKGROUND OF THE INVENTION

1. Field of the Invention

The present invention relates to a negative feedback amplifier, and in particular to a negative feedback amplifier preferably used for driving a capacitive load such as vertical deflection plates or horizontal deflection plates of a CRT for an oscilloscope.

2. Description of the Related Art

FIG. 1 is a circuit diagram showing an example of a conventional amplifier for driving a capacitive load. The amplifier constitutes a balanced amplifier that amplifies a differential signal applied to input terminals IN, and outputs the amplified signal from output terminals OUT as a differential signal. A signal inputted to the input terminals IN is applied to the base of a transistor Q1 (Q2). The collector of the transistor Q1 (Q2) is connected to the base of an NPN transistor Q3 (Q4) of an output stage. Resistors R1 and R2 are input resistors, and resistors R3, R4 and R5 are emitter resistors. The collector of the NPN transistor Q3 (Q4) is connected to its base through a feedback resistor R6 (R7), and the emitter thereof is connected to a voltage source +Vb. The collector of the transistor Q3 (Q4) is further connected to the collector of a PNP transistor Q5 (Q6) and the output terminal OUT. The emitter of the PNP transistor Q5 (Q6) is connected to a voltage source +Vc through an emitter resistor R8 (R9), and the base thereof is connected through bias resistors R10 and R11 (R12 and R13) to the voltage source +Vc and the ground, respectively. In addition, the base of the NPN transistor Q3 (Q4) is connected to the base of the PNP transistor Q5 (Q6) through a capacitor C1 (C2), and the emitter of the NPN transistor Q3 (Q4) is connected to the emitter of the PNP transistor Q5 (Q6) through a capacitor C3 (C4).

With such an arrangement, a positive pulse applied to the base of the transistor Q1 conducts the transistor Q1. This in turn conducts the transistor Q5 by supplying its base with a current through the capacitor C1, as well as cuts off the transistor Q3. Thus, a charging current flows from the capacitor C3 to a load connected to the output terminal OUT via the transistor Q5. After that, the capacitor C3 is charged by a current flowing from the voltage source +Vc to the capacitor C3 through the resistor R8.

On the other hand, a negative pulse applied to the base of the transistor Q1 cuts off the transistor Q1. This in turn conducts the transistor Q3 by supplying a base current thereto, and cuts off the transistor Q5. Thus, a current flows from the load into the voltage source +Vb through the transistor Q3.

In the counterpart circuit comprising the transistors Q2, Q4 and Q4, a current flows into or flows from the load via the output terminal OUT in opposite directions to those of the currents of the above circuit.

This circuit, however, has a disadvantage that the switching on operation of the transistor Q3 is liable to be delayed because of insufficient driving power of the transistors Q3 and Q5. To speed up the switching, the following conditions must be satisfied: the value of the resistor R8 is reduced; standing currents (quiescent collector currents) of the transistors Q3 and Q5 are increased; and the value of the feedback resistor R6 is reduced. Therefore, the transistors Q3–Q6 in the output stage must have large collector dissipations.

Considering this, a circuit that can provide enough driving power without increasing a standing current of the output stage is arranged as shown in FIG. 2. In this figure, the collector of an input stage transistor Q1 (Q2) is connected to the base of a PNP transistor Q7 (Q8). The collector of the transistor Q7 (Q8) is connected to a reference potential, and the emitter thereof is connected to the base of a transistor Q3 (Q4), as well as to the emitter of an NPN transistor Q9 (Q10) through a resistor R14 (R15). The collector of the transistor Q9 (Q10) is connected to a voltage source +Vd, and the base thereof is connected to an output terminal OUT through a resistor R6 (R7). The base of the transistor Q7 (Q8) is connected to the base of the transistor Q9 (Q10) via Zener diodes D1 (D2) so that the two bases has a fixed potential difference.

With this arrangement, the output stage can be sufficiently driven because an amplifier comprising the complementarily connected transistors Q7 and Q9 (Q8 and Q10) is interposed between the input stage transistor Q1 (Q2) and the output stage transistors Q3 and Q5 (Q4 and Q6).

In such a circuit arrangement, however, only an insufficient standing current flows through the input transistor Q1 (Q2), which deteriorates a high frequency band characteristic because of small amplification in the high frequency region such as above several tens of megahertz. In addition, an output voltage decreases in the high frequency region when a capacitive load is connected to the output terminals OUT. the reason for this is as follows: When a load current flowing through a capacitive load connected to the output terminals OUT increases in the high frequency region, a standing current cannot follow the increase in the load current in the high frequency region because the standing current flowing through the output stage is limited by the resistor R8 (R9). Furthermore, in a large amplitude output, the dissipation power of the output stage transistors Q3 and Q4 alters depending on the output signal. This induces changes in temperature and an emitter-to-base voltage $V_{BE}$, which causes waveform distortion such as sag and rounding in the output signal. Still further, in a large amplitude output, the output stage transistors Q3 and Q5, and Q4 and Q6 are saturated, thereby deteriorating high-speed response characteristics.

SUMMARY OF THE INVENTION

Accordingly, it is an object of the present invention to provide a negative feedback amplifier for driving a capacitive load that can improve high frequency band characteristics and prevent reduction in an output voltage, while decreasing a large standing current which is a disadvantage of the related art described above.

Another object of the present invention is to provide a negative feedback amplifier for driving a capacitive load that can improve a low frequency band characteristic causing waveform distortion such as a sag and rounding, so that the amplifier can be suitably employed as a driving amplifier of a CRT for a waveform observer such as an oscilloscope.

Still another object of the present invention is to provide a negative feedback amplifier for driving a capacitive load that can improve a response speed in a large amplitude output.

In a first aspect of the present invention, a negative feedback amplifier comprises:

an input stage including an input terminal to which an input signal is applied, an output terminal producing an output signal of the input stage, and a feedback terminal to which a feedback signal is supplied, the input stage including a common-emitter first transistor whose base is connected to the input terminal, and a common-base second transistor supplying a collector current to the first transistor, collectors of the first and second transistors being connected in common to form the output terminal of the input stage, and an emitter of the second transistor constituting the feedback terminal;

an output stage including an output terminal to be connected to a capacitive load to drive the capacitive load in response to an output signal of the input stage, the output stage including a PNP transistor and an NPN transistor whose collectors are connected in common to form the output terminal of the output stage, and a speed-up capacitor connected between an emitter of the PNP transistor and an emitter of the NPN transistor, the emitter of the PNP transistor being connected to a positive voltage source via a resistor to constitute a complementary circuit, a base of the NPN transistor being DC connected to the output terminal of the input stage, and a base of the PNP transistor being AC connected to the output terminal of the input stage; and a feedback circuit including a feedback resistor connected between the output terminal of the output stage and the feedback terminal of the input stage.

The negative feedback amplifier may further comprise:

a capacitor for AC connecting the base of the PNP transistor of the output stage to the output terminal of the input stage; and a discharge circuit for discharging the capacitor, which is charged by a base current of the PNP transistor, to the speed-up capacitor connected to the emitter of the PNP transistor.

The negative feedback amplifier may further comprise a first limiter diode connected in parallel with the feedback circuit so as to prevent saturation of the NPN transistor of the output stage.

The negative feedback amplifier may further comprise a base bias circuit of the PNP transistor of the output stage, and a second limiter diode connected between the collector of the PNP transistor and the base bias circuit so that a voltage of the collector of the PNP transistor does not exceed a voltage of the base of the PNP transistor.

The negative feedback amplifier may further comprise a current amplification type buffer amplifier connected to the output of the input stage.

The discharge circuit may be a diode.

The discharge circuit may be a parallel circuit of a diode and a resistor.

The discharge circuit may be a resistor.

In a second aspect of the present invention, there is provided a differential amplifier having a pair of negative feedback amplifiers serially connected in mirror symmetric fashion, each of the negative feedback amplifiers comprising:

an input stage including an input terminal to which an input signal is applied, an output terminal producing an output signal of the input stage, and a feedback terminal to which a feedback signal is supplied, the input stage including a common-emitter first transistor whose base is connected to the input terminal, and a common-base second transistor supplying a collector current to the first transistor, collectors of the first and second transistors being connected in common to form the output terminal of the input stage, and an emitter of the second transistor constituting the feedback terminal;

an output stage including an output terminal to be connected to a capacitive load to drive the capacitive load in response to an output signal of the input stage, the output stage including a PNP transistor and an NPN transistor whose collectors are connected in common to form the output terminal of the output stage, and a speed-up capacitor connected between an emitter of the PNP transistor and an emitter of the NPN transistor, the emitter of the PNP transistor being connected to a positive voltage source via a resistor to constitute a complementary circuit, a base of the NPN transistor being DC connected to the output terminal of the input stage, and a base of the PNP transistor being AC connected to the output terminal of the input stage; and a feedback circuit including a feedback resistor connected between the output terminal of the output stage and the feedback terminal of the input stage.

In a third aspect of the present invention, a negative feedback amplifier comprises:

an input stage including an input terminal to which an input signal is applied, an output terminal producing an output signal of the input stage, and a feedback terminal to which a feedback signal is supplied, the input stage including a common-emitter transistor whose base is connected to the input terminal, and a collector resistor whose first terminal is connected to a collector of the transistor for supplying a collector current to the transistor, and whose second terminal is connected to a voltage source, the first terminal of the collector resistor constituting the feedback terminal;

an output stage including an output terminal to be connected to a capacitive load to drive the capacitive load in response to an output signal of the input stage, the output stage including a PNP transistor and an NPN transistor whose collectors are connected in common to form the output terminal of the output stage, and a speed-up capacitor connected between an emitter of the PNP transistor and an emitter of the NPN transistor, the emitter of the PNP transistor being connected to a positive voltage source via a resistor to constitute a complementary circuit, a base of the NPN transistor being DC connected to the output terminal of the input stage, and a base of the PNP transistor being AC connected to the output terminal of the input stage; and a feedback circuit including a feedback resistor connected between the output terminal of the output stage and the feedback terminal of the input stage.

According to the present invention, sufficient amplification can be achieved even in a high frequency band above several tens of megahertz because an enough standing current flows through the common-emitter first transistor in the input stage, thus enabling to produce an output of a large amplitude. In other words, an effect can be accomplished similar to that when a sufficiently small value resistor is used as a feedback resistor.

In addition, since the output signal of the input stage is a current mode, it is not affected by changes in the base-to-emitter voltage $V_{BE}$ of the NPN transistor in the output stage. This can eliminate waveform distortions such as sag and rounding.

Furthermore, when the discharge circuit is added to the AC (alternating current) coupling capacitor, a sufficient base current can flow through the NPN transistor of the output stage. In other words, the NPN transistor can be driven with an enough base current even in a large amplitude operation in a high frequency band where a large amount of base current is required, thus improving reduction in the output voltage in the high frequency band.

Moreover, the first limiter diode can prevent the saturation of the NPN transistor in the output stage, and the second limiter diode can prevent the saturation of the PNP transistor. As a result, both transistors can operate without saturation even in a large amplitude output, thereby preventing degradation of a high speed response.

Finally, the buffer amplifier further enhances the output signal in a high frequency band.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

FIRST EMBODIMENT

Figure 1:
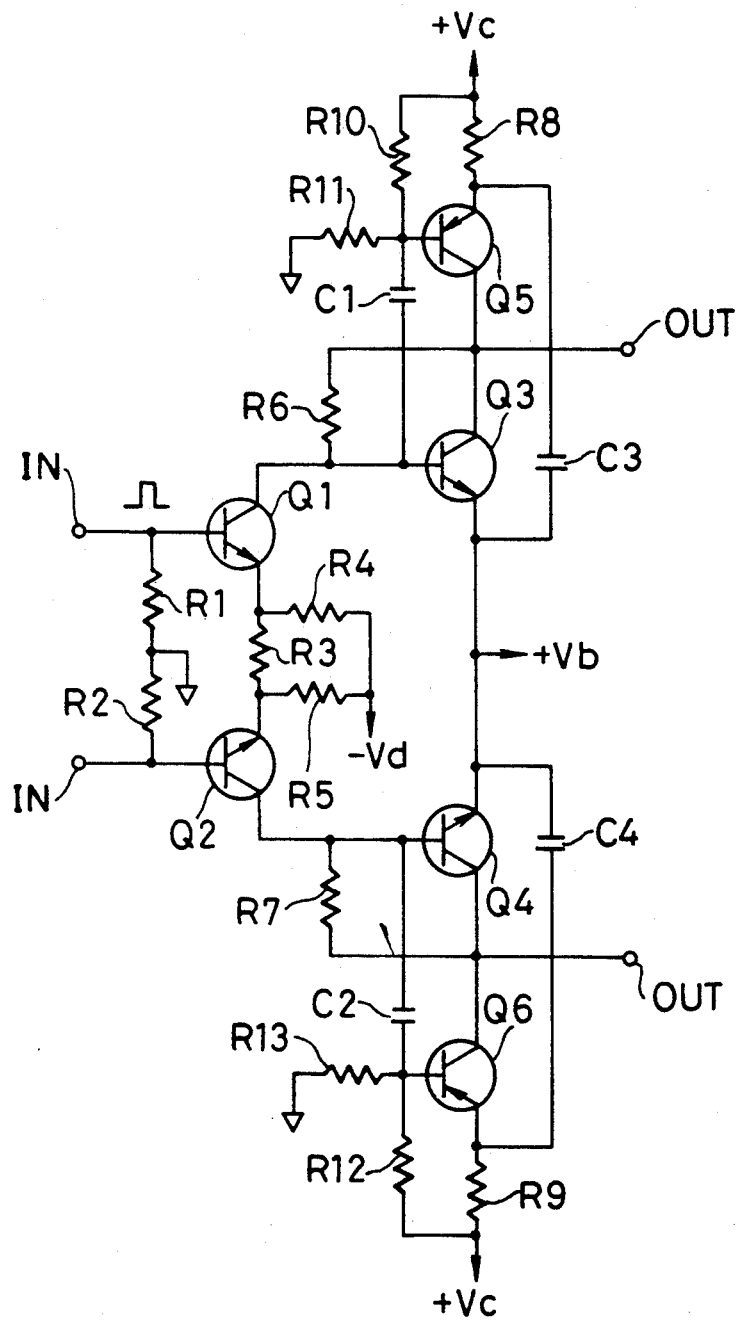
FIG. 1 is a circuit diagram showing an arrangement of a conventional amplifier for driving a capacitive load.
Figure 2:
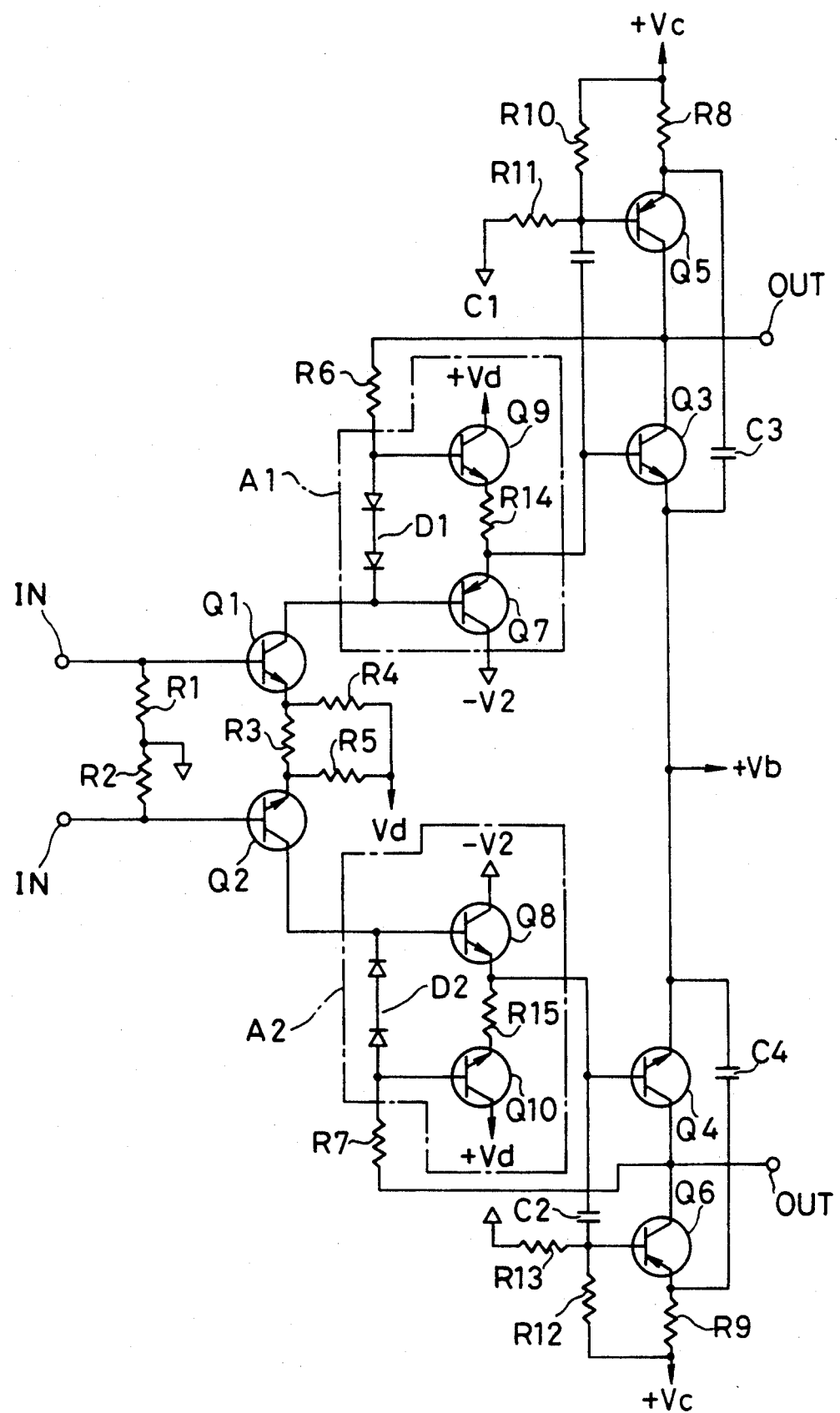
FIG. 2 is a circuit diagram showing an arrangement of another conventional amplifier for driving a capacitive load.
Figure 3:
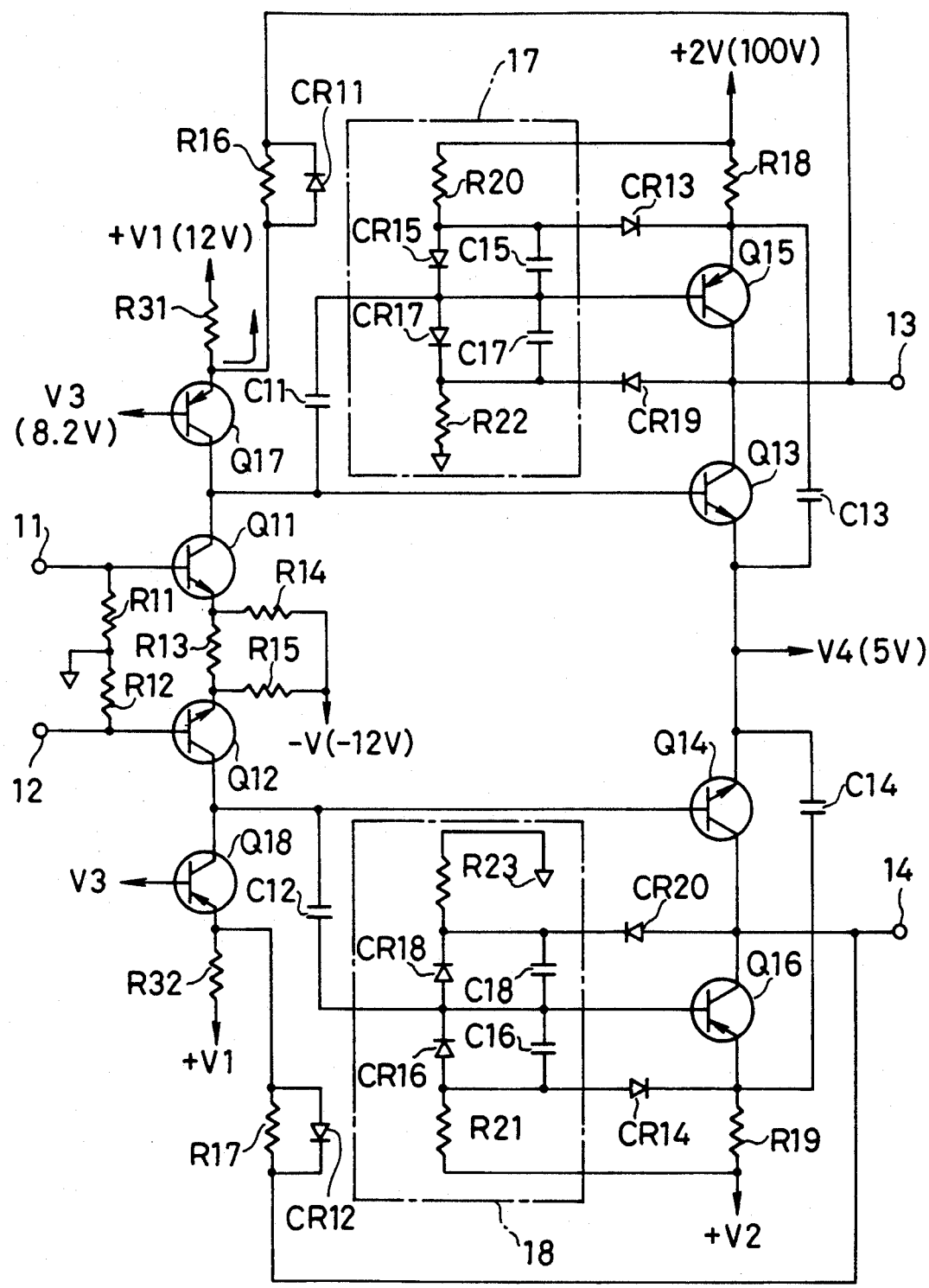
FIG. 3 is a circuit diagram showing an arrangement of a first embodiment of a negative feedback amplifier for driving a capacitive load according to the present invention.

FIG. 3 is a circuit diagram showing a first embodiment of a feedback amplifier according to the present invention. This amplifier is arranged as a differential input, differential output, balanced type feedback amplifier so that it can be suitably employed as a vertical or horizontal output amplifier of an oscilloscope.

In this figure, transistors Q11 and Q17 (Q12 and Q18) constitute a common-emitter differential amplifier as an input stage that amplifies an input signal applied to their bases 11 and 12. A resistor R14 (R15) is for passing a standing current (a quiescent collector current) of the transistor Q11 (Q12) flowing through a resistor R31 (R32). A resistor R13 is an emitter resistor for determining the gain of the feedback amplifier together with a feedback resistor R16 (R17). The gain A is expressed by the following equation:

$$A \approx (R16 + R17)/R13$$

A transistor Q17 (Q18) is a common-base transistor for passing the standing current flowing through the resistor R31 (R32). The emitter of the transistor Q17 (Q18) is supplied with a feedback signal from an output terminal 13 (14) through a feedback resistor R16 (R17), while the collector of the transistor Q17 (Q18) is connected to the collector of the common-emitter transistor Q11 (Q12). Thus, a change in the collector current of the transistor Q11 (Q12) is produced as an output of the input stage, which drives an output stage.

Transistors Q13 and Q15 (Q14 and Q16) constitute the output stage. The transistor Q13 (Q14) is DC coupled with the input stage, whereas the transistor Q15 (Q16) is AC coupled with the input stage through an AC coupling capacitor C11 (C12). Thus, the transistor Q13 (Q14) amplifies from a DC to a high-frequency component (for example, from DC to 200 MHz), while the transistor Q15 (Q16) amplifies an AC component, particularly, a high frequency band component (for example, from 50 kHz-200 MHz) flowing through a capacitive load. An output signal is produced from output terminals 13 and 14 so as to drive the capacitive load. Here, the output terminal 13 is connected to a common connecting point of the collectors of both transistors Q13 and Q15, while the output terminal 14 is connected to a common connecting point of the collectors of both transistors Q14 and Q16.

A resistor R20 (R21), a diode CR15 (CR16), a capacitor C15 (C16), a diode CR17 (CR18), a capacitor C17 (C18) and a resistor R22 (R23) constitute a base bias circuit 17 (18) of the transistor Q11 (Q12). A diode CR13 (CR14) is a discharge circuit of the AC coupling capacitor C11 (C12). The discharge level thereof is determined by a bias circuit comprising the diode CR15 and the capacitor 15 (the diode CR16 and the capacitor C16). Although in FIG. 3, the discharge circuit is made up of the diode CR13 (CR14), which is appropriate for an input signal including a pulse, it may be replaced with other components: for example, a parallel circuit of a resistor and a diode, or only a resistor can be preferably used when a highly linear input signal is handled.

A limiter diode (a second limiter diode) CR19 (CR20) is connected to the collector of the PNP transistor Q15 (Q16) so as to prevent the transistor Q15 (Q16) from entering into saturation in which the collector voltage becomes higher than the base voltage. The diode CR17 and the capacitor C17 (the diode CR 18 and the capacitor (C18) constitute a bias circuit for adjusting an operational voltage of the limiter diode CR19 (CR20).

The feedback resistor R16 (R17) and a diode CR11 (CR12) connected in parallel fashion constitute a feedback circuit. The feedback resistor R16 (R17) feeds an output signal of the output stage back to the feedback terminal of the input stage, thus constituting a negative feedback amplifier. The diode CR11 (CR12) is a first limiter diode for preventing the NPN transistor Q13 (Q14) of the output stage from entering into saturation in which the collector voltage becomes lower than the base voltage.

Incidentally, in FIG. 3, the voltage V1 is +12 V, the voltage V2 is +100 V, the voltage −V is −12 V, the voltage V3 is +8.2 V and the voltage V4 is +5 V.

Next, the operation of this embodiment will be described.

Figure 4:
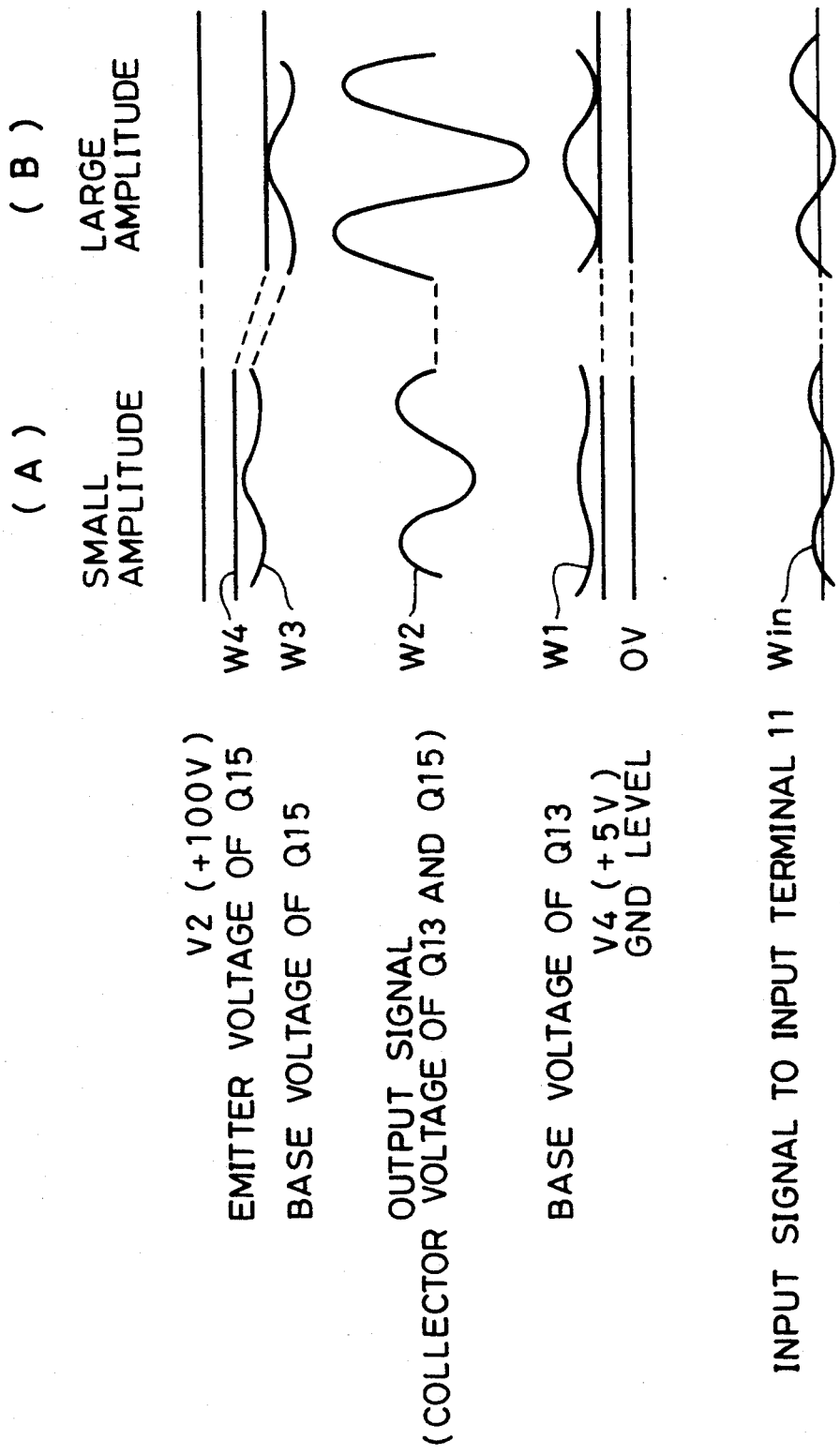
FIG. 4 is a waveform diagram illustrating waveforms of major portions of the first embodiment.

FIG. 4 is a diagram illustrating waveforms of the embodiment in a high frequency band. Section (A) shows waveforms in a small amplitude operation, and section (B) shows waveforms in a large amplitude operation. These are waveforms of some portions of the upper half of FIG. 3: Win designates an input signal to the input terminal 11; W1, a collector voltage of the transistor Q11 or a base voltage of the transistor Q13; W2, a collector voltage of the transistors Q13 and Q15, that is, the output voltage; W3, a base voltage of the transistor Q15; and W4, an emitter voltage of the transistor Q15.

When the input voltage applied to the input terminal 11 increases, the collector voltage of the transistor Q11 drops, and the base current of the transistor Q13 decreases. Accordingly, the collector current of the transistor Q13 decreases, thereby increasing the collector voltage thereof. At the same time, the base voltage of the transistor Q15 drops as the collector voltage of the transistor Q11 drops, and the base current of the transistor Q15 flowing through the capacitor C11 increases. This increases the collector current of the transistor Q15, which in turn increases the collector voltage of the transistor Q15. In contrast, when the input voltage applied to the input terminal 11 drops, the collector voltage of the transistors Q13 and 15 drops by the mechanism contrary to that described above.

When the collector voltage of the transistor Q13 drops below the base voltage V3 of the transistor Q17, the first limiter diode CR11 conducts so that a standing current flows, through the limiter diode CR11, into the collector of the transistor Q13. Therefore, the standing current flowing into the transistor Q17 decreases, and hence, the output current of the input stage also decreases. As a result, the base current of the transistor Q13 decreases, and so the collector current thereof reduces. Thus, the saturation of the transistor Q13 is prevented.

On the other hand, saturation of the transistor Q15 is prevented as follows: When the input voltage to the transistor Q11 increases, the collector voltage of the transistor Q11 decreases. This will increase the base current of the transistor Q15 flowing through the capacitor C11 so that the collector current of the transistor Q15 increases, which in turn raises the collector voltage of the transistor Q15. In this case, the cathode voltage of the second limiter diode CR19 is lower than the base voltage of the transistor Q15 by the forward drop voltage $V_F$ (about 0.6 volt) of the diode CR17. When the collector voltage of the transistor Q15 increases to exceed the cathode voltage of the diode CR19 by the forward voltage $V_F$, the diode CR 19 conducts so that the collector current of the transistor Q15 flows through the diode CR19, the capacitor C17, and the capacitor C11, thus decreasing the base current of the transistor 15. In other words, when the collector voltage of the transistor Q15 tries to exceed the base voltage thereof, the base current is decreased, and hence, the collector voltage never exceeds the base voltage. This means that the collector-to-emitter voltage of the transistor Q13 is maintained higher than the forward drop voltage $V_F$. Here, the capacitance of the capacitor C11 is set much smaller than that of the capacitor C17: for example, C11=0.01 $\mu$F and C17 is 0.1 $\mu$F. The collector-to-emitter voltage can be appropriately set by constituting the diode CR17 by a plurality of diodes connected in series.

Thus, when a passage of the collector current of the transistor Q15 (Q16) is cut owing to the cutoff or near cutoff of the NPN transistor Q13 (Q14), and hence, when the collector voltage of the PNP transistor Q15 (Q16) tries to become higher than the base voltage, the collector current flows through the limiter diode CR19 (CR20) and the capacitor C11 (C12) so that the base current of the transistor Q15 (Q16) decreases, thereby preventing the saturation of the transistor Q15 (Q16).

Next, the function of the AC coupling capacitor or the speed-up capacitor C11 is considered. The voltage across the speed-up capacitor C11 is about zero when the amplifier is in the quiescent state. In this state, when the collector voltage W1 of the input transistor Q11 increases as shown in FIG. 4, a discharge current of the AC coupling capacitor C11 flows through the capacitor C15, the diode CR13, and the capacitor C13, thereby speeding up the rise of the output voltage, and reducing the voltage across the capacitor C11 to an amplitude e/2 of the voltage W1. Here, it is assumed that the capacitance of the capacitor C11 is much smaller than those of the capacitors C15 and C13: for example, C11=0.01 $\mu$F, C15=0.1 $\mu$F. On the other hand, when the collector voltage W1 of the transistor Q11 decreases, the base current of the transistor Q15 increases by an amount corresponding to the decrease of the voltage W1 plus the previous discharge of the capacitor C11, that is, corresponding to peak-to-peak amplitude e of the voltage W1. As a result, the capacitor C13 discharges until the potential of the capacitor 13 is reduced by the voltage e corresponding to the peak-to-peak amplitude of the voltage W1, and stops speed-up function. During this process, the capacitor C11 is charged by the base current of the transistor Q15, and the voltage across the capacitor C11 decreases by the voltage e corresponding to the peak-to-peak amplitude of the base voltage of the transistor Q15.

Meanwhile, the emitter potential reaches a stable state when the current quantity outputted to the load balances the current quantity supplied to the emitter of the transistor Q15 through the resistor R18. Thus, the emitter potential and the base potential of the transistor Q15 decrease as the amplitude of the input signal applied to the input terminal 11 increases as indicated by the waveforms W3 and W4 in FIG. 4. Therefore, the voltage across the resistor R18 increases, which in turn increases the standing current of the output stage, thereby supplying a sufficient output voltage to a capacitive load as indicated by the waveform W2.

Although the transistor Q17 (Q18) is used to supply the standing voltage to the transistor Q11 (Q12) in the embodiment, the transistor Q17 (Q18) can be replaced with a resistor whose value is much larger than the resistor R31. In this case, the feedback resistor R16 is connected to the collector of the transistor Q11.

SECOND EMBODIMENT

Figure 5:
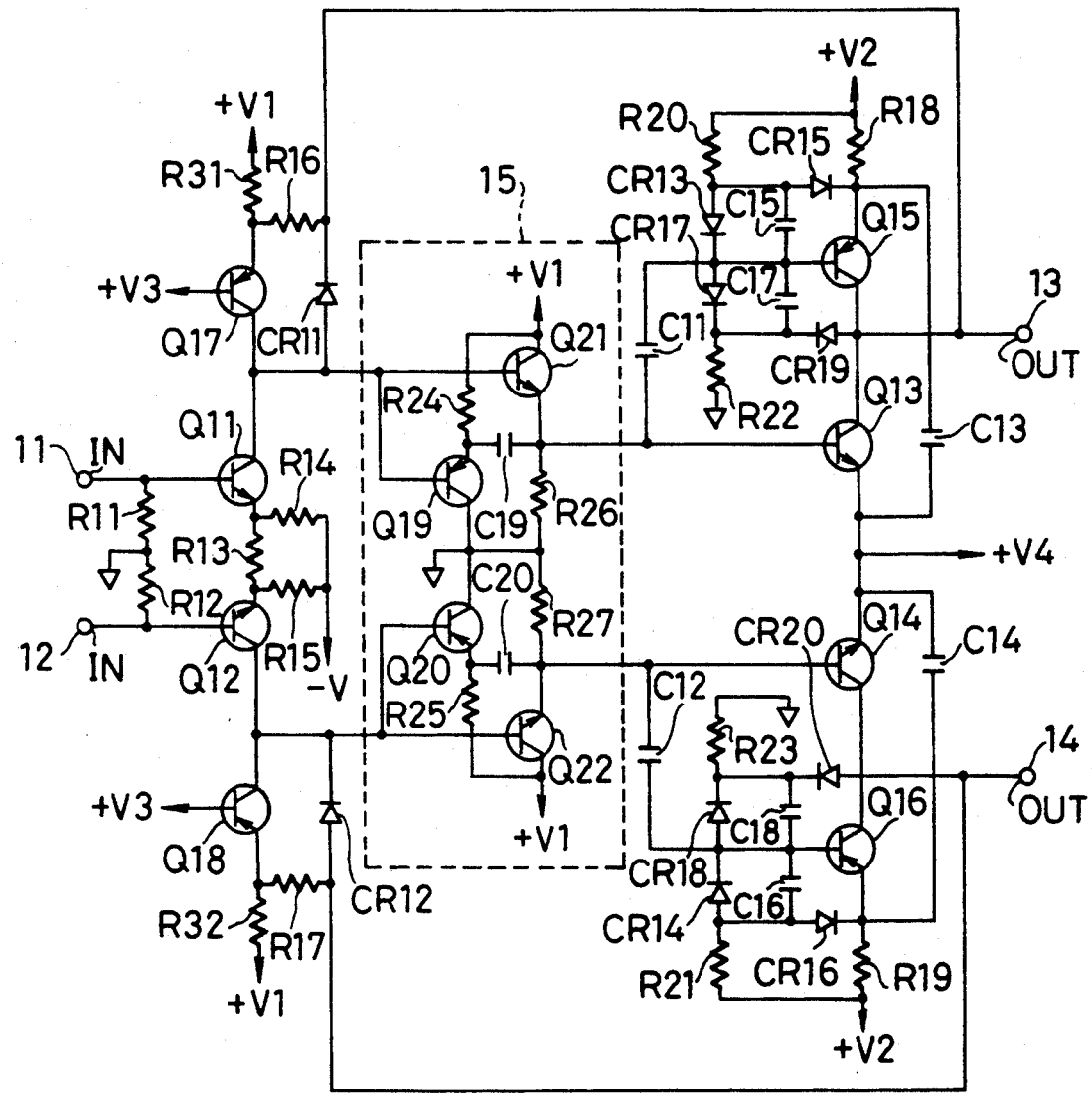
FIG. 5 is a circuit diagram showing an arrangement of a second embodiment of a negative feedback amplifier for driving a capacitive load according to the present invention.

FIG. 5 shows a second, more preferable embodiment of a negative feedback amplifier according to the present invention. The second embodiment has an arrangement of the first embodiment plus a buffer amplifier 15 for performing current amplification of the output signal of an input stage. This arrangement enables the input stage to drive the output stage more sufficiently, thereby achieving a quicker response.

In FIG. 5, an NPN transistor Q21 (Q22) is an emitter follower for performing current amplification of the output signal of the input stage. A resistor R26 (R27) is an emitter resistor for passing the emitter current of the transistor Q21 (Q22).

A PNP transistor Q19 (Q20) is an emitter follower for enhancing the driving power of the negative phase of the transistor Q21 (Q22). A resistor R24 (R25) is an emitter resistor for passing the emitter current of the transistor Q19 (Q20). The emitter of the transistor Q19 (Q20) and the emitter of the transistor Q21 (Q22) are connected via an AC coupling capacitor C19 (C20) so that the outputs of the transistors Q19 and Q21 (Q20 and Q22) are mixed.

A limiter diode (a first limiter diode) CR11 (CR12) of a feedback circuit is connected between the output terminal of the input stage and the output terminal 13 (14) of the output stage. This will serve to stabilize the limiter operation which would otherwise become unstable owing to the increased gain by the buffer amplifier 15.

The negative feedback amplifier according to the present invention is applicable not only to a vertical output amplifier of an oscilloscope, but also to a horizontal (time-axis) output amplifier and a Z-axis output amplifier. This will serve to realize low power consumption, good frequency characteristic oscilloscopes at relatively low cost. Moreover, the negative feedback amplifier can be used as R, G and B output amplifiers of a high-definition television set, as output amplifiers of TV-waveform monitors of a vectorscope, or the like, which require high speed response.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A negative feedback amplifier comprising:

an input stage including an input terminal to which an input signal is applied, an output terminal producing an output signal of said input stage, and a feedback terminal to which a feedback signal is supplied, said input stage including a common-emitter first transistor whose base is connected to said input terminal, and a common-base second transistor supplying a collector current to said first transistor, collectors of said first and second transistors being connected in common to form said output terminal of said input stage, and an emitter of said second transistor constituting said feedback terminal;

an output stage including an output terminal to be connected to a capacitive load to drive said capacitive load in response to an output signal of said input stage, said output stage including a PNP transistor and an NPN transistor whose collectors are connected in common to form said output terminal of said output stage, and a speed-up capacitor connected between an emitter of said PNP transistor and an emitter of said NPN transistor, the emitter of said PNP transistor being connected to a positive voltage source via a resistor to constitute a complementary circuit, a base of said NPN transistor being DC connected to said output terminal of said input stage, and a base of said PNP transistor being AC connected to said output terminal of said input stage; and a feedback circuit including a feedback resistor connected between said output terminal of said output stage and said feedback terminal of said input stage.

2. The negative feedback amplifier as claimed in claim 1, further comprising:

a capacitor for AC connecting the base of said PNP transistor of said output stage to said output terminal of said input stage; and a discharge circuit for discharging said capacitor, which is charged by a base current of said PNP transistor, to said speed-up capacitor connected to the emitter of said PNP transistor.

3. The negative feedback amplifier as claimed in claim 1, further comprising a first limiter diode connected in parallel with said feedback circuit so as to prevent saturation of said NPN transistor of said output stage.

4. The negative feedback amplifier as claimed in claim 1, further comprising a base bias circuit of said PNP transistor of said output stage, and a second limiter diode connected between the collector of said PNP transistor and said base bias circuit so that a voltage of the collector of said PNP transistor does not exceed a voltage of the base of said PNP transistor.

5. The negative feedback amplifier as claimed in claim 1, further comprising a current amplification type buffer amplifier connected to the output of said input stage.

6. The negative feedback amplifier as claimed in claim 2, wherein said discharge circuit is a diode.

7. The negative feedback amplifier as claimed in claim 2, wherein said discharge circuit is a parallel circuit of a diode and a resistor.

8. The negative feedback amplifier as claimed in claim 2, wherein said discharge circuit is a resistor.

9. A differential amplifier having a pair of negative feedback amplifiers serially connected in mirror symmetric fashion, each of said negative feedback amplifiers comprising:

an input stage including an input terminal to which an input signal is applied, an output terminal producing an output signal of said input stage, and a feedback terminal to which a feedback signal is supplied, said input stage including a common-emitter first transistor whose base is connected to said input terminal, and a common-base second transistor supplying a collector current to said first transistor, collectors of said first and second transistors being connected in common to form said output terminal of said input stage, and an emitter of said second transistor constituting said feedback terminal;

an output stage including an output terminal to be connected to a capacitive load to drive said capacitive load in response to an output signal of said input stage, said output stage including a PNP transistor and an NPN transistor whose collectors are connected in common to form said output terminal of said output stage, and a speed-up capacitor connected between an emitter of said PNP transistor and an emitter of said NPN transistor, the emitter of said PNP transistor being connected to a positive voltage source via a resistor to constitute a complementary circuit, a base of said NPN transistor being DC connected to said output terminal of said input stage, and a base of said PNP transistor being AC connected to said output terminal of said input stage; and a feedback circuit including a feedback resistor connected between said output terminal of said output stage and said feedback terminal of said input stage.

10. A negative feedback amplifier comprising:

an input stage including an input terminal to which an input signal is applied, an output terminal producing an output signal of said input stage, and a feedback terminal to which a feedback signal is supplied, said input stage including a common-emitter transistor whose base is connected to said input terminal, and a collector resistor whose first terminal is connected to a collector of said transistor for supplying a collector current to said transistor, and whose second terminal is connected to a voltage source, said first terminal of said collector resistor constituting said feedback terminal;

an output stage including an output terminal to be connected to a capacitive load to drive said capacitive load in response to an output signal of said input stage, said output stage including a PNP transistor and an NPN transistor whose collectors are connected in common to form said output terminal of said output stage, and a speed-up capacitor connected between an emitter of said PNP transistor and an emitter of said NPN transistor, the emitter of said PNP transistor being connected to a positive voltage source via a resistor to constitute a complementary circuit, a base of said NPN transistor being DC connected to said output terminal of said input stage, and a base of said PNP transistor being AC connected to said output terminal of said input stage; and a feedback circuit including a feedback resistor connected between said output terminal of said output stage and said feedback terminal of said input stage.

* * * * *